(12) United States Patent
Brunet et al.

(10) Patent No.: US 7,992,790 B2
(45) Date of Patent: Aug. 9, 2011

(54) METHOD OF PRODUCING A CONTACTLESS MICROELECTRONIC DEVICE, SUCH AS FOR AN ELECTRONIC PASSPORT

(75) Inventors: Olivier Brunet, Marseilles (FR); Jean-Francois Salvo, Rocbaron (FR); Ivan Peytavin, Aix en Provence (FR)

(73) Assignee: Smart Packaging Solutions (SPS), Rousset (FR)

( * ) Notice: Subject to any disclaimer, the term of this patent is extended or adjusted under 35 U.S.C. 154(b) by 304 days.

(21) Appl. No.: 11/884,123

(22) PCT Filed: Feb. 3, 2006

(86) PCT No.: PCT/FR2006/000271
§ 371 (c)(1),
(2), (4) Date: Sep. 24, 2008

(87) PCT Pub. No.: WO2006/084984
PCT Pub. Date: Aug. 17, 2006

(65) Prior Publication Data
US 2009/0057414 A1 Mar. 5, 2009

(30) Foreign Application Priority Data
Feb. 11, 2005 (FR) ...................... 05 01378

(51) Int. Cl.
*G06K 19/06* (2006.01)
(52) U.S. Cl. .................. 235/492; 340/572.7; 340/572.8; 438/127
(58) Field of Classification Search .................. 235/492; 340/572.7, 572.8; 438/127
See application file for complete search history.

(56) References Cited

U.S. PATENT DOCUMENTS

| 6,100,804 A | 8/2000 | Brady et al. | |
|---|---|---|---|
| 2004/0061994 A1* | 4/2004 | Kerr et al. | 361/679 |
| 2004/0062016 A1* | 4/2004 | Kerr et al. | 361/761 |
| 2008/0150817 A1* | 6/2008 | Carre et al. | 343/741 |

FOREIGN PATENT DOCUMENTS

| EP | 1 406 209 | 4/2004 |
|---|---|---|
| FR | 2 824 018 | 10/2002 |
| WO | WO 00/22893 | 4/2000 |
| WO | WO 01/03188 | 1/2001 |

* cited by examiner

*Primary Examiner* — Allyson N Trail
(74) *Attorney, Agent, or Firm* — Buchanan Ingersoll & Rooney PC

(57) ABSTRACT

A method of manufacturing a microelectronic device with contactless operation, mainly for electronic passports. An antenna is made on a thin, flexible substrate. A perforated sheet that is thin and calibrated, and that has at least one cavity in its thickness, is placed on the substrate. A microelectronic chip is placed in each cavity of the perforated sheet and the output contacts of the microelectronic chip are connected to corresponding terminals of the antenna. The microelectronic chip is protected by sealing off the cavity that contains the chip. The method is particularly adapted for manufacturing electronic radiofrequency identification devices, in particular for electronic passports.

16 Claims, 2 Drawing Sheets

METHOD OF PRODUCING A CONTACTLESS MICROELECTRONIC DEVICE, SUCH AS FOR AN ELECTRONIC PASSPORT

The invention relates to a method of manufacturing a radiofrequency identification device and an identification device structure obtained by implementing the method. The invention also relates to using the identification device for the creation of secure, unforgeable identity documents such as, for example, electronic passports.

In the state-of-the-art, there are known methods of manufacturing radiofrequency identification devices, according to which a radiofrequency electronic system consisting of a microelectronic chip connected to an antenna is placed on an insulating substrate. Then, the substrate equipped with the electronic system made up of the chip and the antenna is laminated over with one or several layers of more or less compressible materials, intended to protect and integrate the electronics.

These known methods and the resulting devices have a series of disadvantages. Thus, the known manufacturing processes most often lead to devices that are considerably thick, around 0.6 mm or more, or relatively uneven, which is a drawback particularly when these devices must be used for the creation of electronic identity documents, such as electronic passports. The new electronic passports have very restrictive specifications in that regarding their mechanical strength and useful life, which must be several years, in particular ten years in the case of Europe.

Furthermore, the radiofrequency identification devices required today must enable integration with no excessive thickness in the pages of identity documents such as passports, and have a size and mechanical features, in particular flexibility, that are compatible with the specifications of these documents.

One aim of the invention is therefore to provide a method of manufacturing radiofrequency identification devices that ensures high reliability of the devices obtained over time. Another aim of the invention is for the method to make it possible to produce radiofrequency identification devices that can be used in a large number of applications, so as to benefit from very high volumes, and therefore from reduced unit costs. In fact, bearing in mind the vast number of identification devices to be supplied to security organisations, such as those of certain States, it is essential to have a technique for manufacturing radiofrequency identification devices that is extremely straightforward, ensuring low manufacturing costs with regard to the foreseen application, while having sufficient reliability to guarantee the required useful life.

Another aim of the invention is to provide a method of manufacturing radiofrequency identification devices that make it possible to obtain, in a reliable and repetitive fashion, identification devices with a very even, reduced thickness, of several hundred micrometers, for example less than 400 micrometers.

For this purpose, the invention relates to a method of manufacturing radiofrequency identification devices according to the claims.

Other characteristics and advantages of the invention will become apparent from reading the detailed description of the appended drawings in which.

Figure 1:
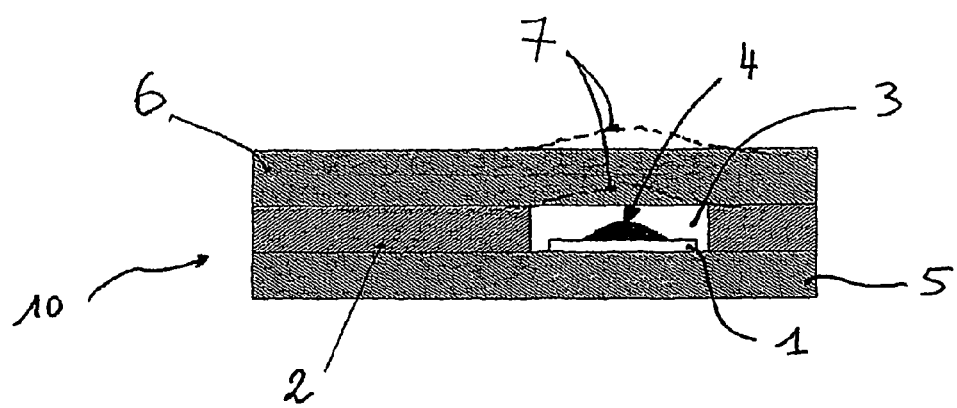
FIG. 1 shows a method of manufacturing radiofrequency identification devices according to the state-of-the-art.

The following refers to FIG. 1.

This figure shows a cross-section of an electronic device 10 for passports or similar products, manufactured using a known technique. To manufacture this device, an electronic micromodule 1 is placed on a support sheet 5 in the cavity 3 of a sheet of paper 2. The micromodule 1 is equipped with an antenna (not shown) and a silicon chip 4 connected to the antenna. In order to fill in the empty space in the cavity 3 above and around the chip 4, a levelling resin is used to fill in the cavity, and the cavity 3 is then covered using a sheet 6 of the same nature as the sheet 2 that contains the cavity. After covering it, the electronic module 10 needs to be cooked in an oven in order to interlace the levelling resin. However, this operation has a number of disadvantages. First of all, it takes a very long time—several hours—and requires considerable amounts of equipment, such as ovens. In addition, interlacing causes deformations, due to the swelling and subsequent contraction of the levelling resin, which are disadvantageous when the aim is to obtain very thin products, such as products intended to be included in passports. Moreover, the manufacturers of paper for passports, and their printer customers, generally have the know-how required to laminate sheets such as those used for manufacturing passports, but the operations of filling with resin and cooking are completely unknown to manufacturers of passports or similar documents, which complicates implementation of the known method of manufacturing electronic modules for passports.

Figure 2:
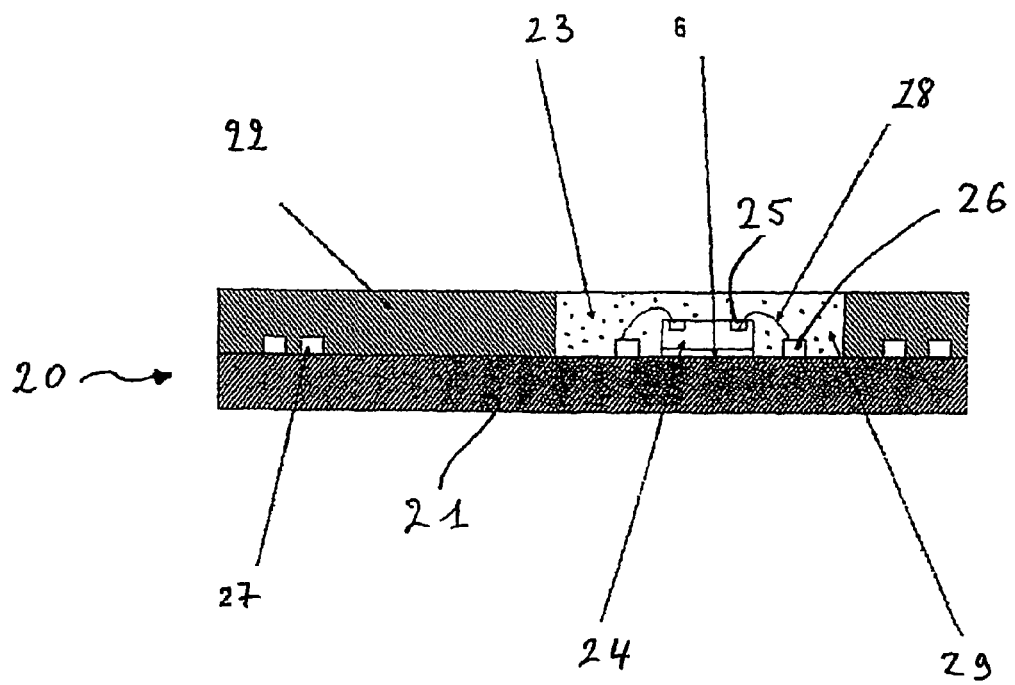
FIG. 2 shows a first way to carry out the manufacturing method according to the invention.

The following refers to FIG. 2, which shows a cross-section of a radiofrequency identification device 20 manufactured according to a first way to carry out the manufacturing method according to the invention.

Each radiofrequency identification device 20 comprises a substrate 21 on which a thin, calibrated sheet 22 is placed, which contributes, in the manner of a spacer, to obtaining a fine, calibrated thickness of the radiofrequency identification device 20. This sheet 22 comprises in its thickness one or several perforations, that pass through it or not, and which form a series of cavities 23, in the location planned for receiving a microelectronic chip 24 coming from a small plate that is cut into sections by sawing. Due to the perforations it contains, the sheet will be referred to as "perforated sheet" for the purpose of this description. Each cavity 23 of the perforated sheet 22 passes through it in the method of manufacturing in FIG. 2, so that once the perforated sheet 22 has been placed on the substrate 21, the output contacts of the microelectronic chip 24 remain accessible for establishing a connection with the terminals 26 of the antenna.

According to the invention, the substrate is relatively flexible. Preferably, though not exclusively, made from polyimide or polyepoxy, it is preferably continuous and packaged in a roll and is covered at least on one of its faces with a very thin adhesive film (not shown). Likewise, the perforated sheet 22 is preferably, but not exclusively, made from polyethyleneterephtalate or polyimide. More specifically, it can be made mainly from materials belonging to the polyetherimide (PEI), polyimide or polyester (polyethylene naphtalate or PEN; polyethylene terephtalare or PET) families. These materials are selected because they have a tensile modulus of around 2 to 4 gigapascals (Gpa).

The sheet 22 is packaged in a roll and is placed on the substrate 21 by laminating on the face of the substrate that is coated with an adhesive film obtained by coating or by using a "hot-melt" adhesive film, or even pressure-sensitive adhesive. The cohesion between the two layers 21 and 22 is thus provided by the adhesive which is, for example, of the epoxy type. The thickness of the layer of adhesive material depends on specific requirements, comprised within a bracket ranging from 5 to 70 micrometers.

However, the adhesion can also be obtained without using adhesive, by using the intrinsic adhesive properties of the materials themselves, such as PET.

It is crucial in order to assure a reduced, calibrated thickness of the assembly 20 thus assembled, for the flexible substrate 21 and the perforated sheet 22 each to have an essentially even thickness, the sum of their thicknesses being less than around 350 micrometers. The thickness of the perforated sheet 22 is constant and calibrated. It is slightly thicker than the microelectronic chip 24.

The chip 24 placed in the cavity 23 is glued to the substrate 21 by means of glue that can be a conductor of electricity or an electrical insulator (process known as "die attach") at the level of the interface between the substrate 21 and the perforated sheet 22. The active face of the chip is placed so that the output contacts 25 are pointing towards the opening of the cavity 23.

The output contacts 25 of the chip are electrically connected to the relevant terminals 26 of the antenna 27 using a known wire-bonding technique, which consists of connecting the output contacts 25 of the chip 24 with the contact terminals 26 of the printed circuit board using conductor wires 28 and solders.

It should be noted that the chip 24 and the antenna 27 can also be electrically interconnected using another technique known as "flip chip", according to which a chip with conductive bumps made from metal or polymer is used, glued to the substrate so that the active face of the chip that contains the output contacts of the chip is pointing downwards (according to the directions shown in FIG. 2). The electrical connection is provided by the conductive bumps of the substrate, connected to the respective terminals of the antenna.

Yet another connection possibility consists of using a "wire deposition" technique, in which the face of the chip opposite the face that contains the output contacts is glued to the substrate, so that the output contacts are presented towards the top of the cavity. Then, a connection is made by depositing a low-viscosity conductive substance between each output contact of the chip and the corresponding terminal of the antenna.

When the electrical connections 28 are made, the chip wired in the body is "potted", which consists of protecting the chip 24 and the soldered connection wires 28, or the conductive bumps, when applicable, by filling in the rest of the cavity 23 using a liquid encapsulating resin which can, for example, have a silicone epoxy or polyurethane base, and subsequently polymerising the resin in order to harden it. In this way, the cavity 23 is filled in and blocked and a particularly thin radiofrequency identification device 20 is obtained, with a particularly calibrated thickness.

In addition, its flexibility can be perfectly adapted to the various final applications, since a skilled worker will easily know how to choose the flexibility of the substrate material 21 and of the perforated sheet 22, as well as the viscosity of the encapsulating resin 29, according to the desired characteristics of flexibility and durability.

The encapsulating resin 29 will be selected, for example, from the single-component, solvent-free, electrically insulating resins, mainly from the epoxy or acrylate families. Their polymerisation is obtained by hot interlacing or ultraviolet radiation, or both. Their characteristics in terms of viscosity (cone plane viscosity at 25° C.) range from 400 millipascals·second (mPa·s) to 45000 mPa·s, with hardness characteristics after interlacing equal to 60 to 90 shore D.

In that regarding the dimensions of the radiofrequency identification device 20 according to the invention, they may depend on the final applications, mainly on the desired range, which conditions the size of the antenna. In practice, identification devices 20 designed to communicate over short distances and to be included in passports or other similar supports, can be particularly small in size, for example with a length comprised between around 14 mm and around 25 mm, a width comprised between around 13 mm and around 19 mm and a thickness of less than around 350 micrometers.

With a view to obtaining a stack with a relatively constant, calibrated thickness, the perforated sheet 22 and the substrate must have thickness tolerances that are less than or equal to 20 micrometers.

In order to install the antenna on the substrate 21, a subtractive process such as engraving, a process of adding metal (in particular copper or aluminium) or a process of silk-screen printing a conductive material (conductive glue or ink) will be used on a dielectric support, in particular one made from polyimide or epoxy. According to the specific needs and the technology used, the thickness of the antenna will range from 2 to 70 micrometers.

Figure 3:
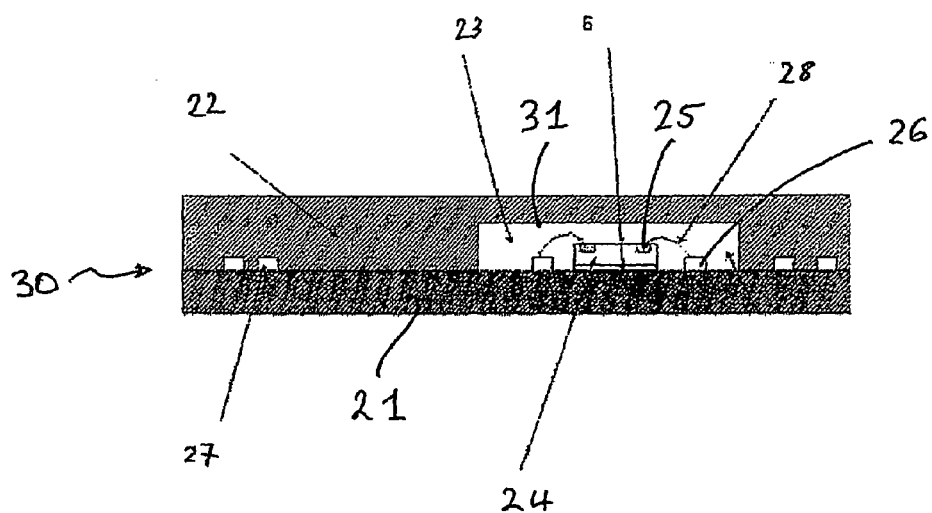
FIG. 3 shows a variant on the manufacturing method in FIG. 2.

The following refers to FIG. 3. In this alternative way of manufacturing a radiofrequency identification device 30 according to the invention, the cavity 23 in the perforated sheet 22 does not pass through the sheet.

In this manufacturing method, the first step is to place the antenna 27 on the substrate 21. Then, a microelectronic chip 24 is glued to the substrate 21, on the same side as the antenna 27, and the contacts 25 of the chip 24 are electrically connected to the terminals 26 of the antenna, using one of the interconnection techniques described previously.

After establishing the connections between the output contacts 25 of the chip 24 and the terminals 26 of the antenna and encapsulating the chip, the perforated sheet 22 is laminated onto the substrate 21 so that the cavity 23 encapsulates and protects the microelectronic chip.

Figure 4:
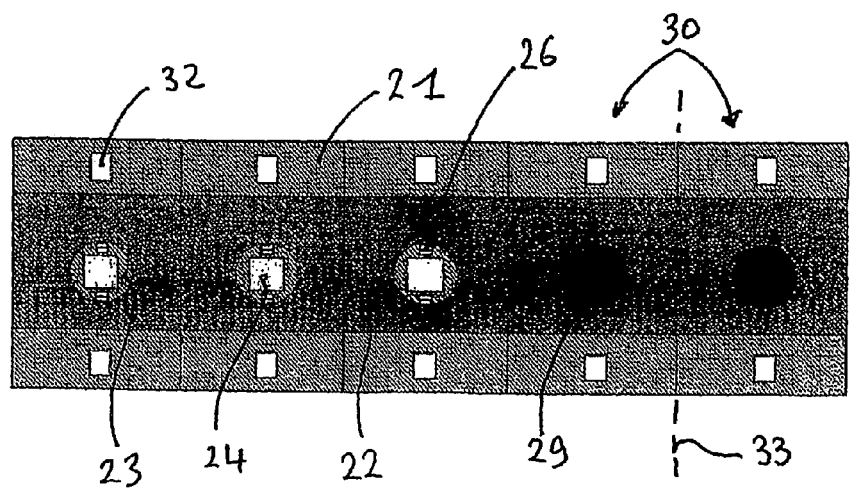
FIG. 4 shows a method for continuous manufacturing of radiofrequency identification devices according to the invention.

The following refers to FIG. 4.

This figure shows a substrate sheet 21 in a strip configuration, for example with a length of 35 mm, wound into a roll, and surmounted by a perforated sheet 22, also in the form of a strip. The substrate strip 21 comprises on its sides a series of driving holes 32 intended to cooperate with the teeth of a laminating machine (not shown), so as to drive the substrate strip 21. The strip of material of the perforated sheet 22 comprises a series of cavities 23 spaced out at regular intervals, in each of which a microelectronic chip 24 and the resin 29 described above can be inserted. In the bottom of each cavity are visible the terminals 26 of each antenna, made on the substrate strip 21 by any of the known techniques, for example, by depositing a conductive material.

According to the invention, the substrate strip 21 coated with an adhesive material, and the strip of perforated sheet 22 are laminated together using known laminating machines. Throughout the laminating process, each cavity 23 is equipped with its own microelectronic chip, which is electrically connected to the terminals of the antenna, and then each cavity 23 is filled in with encapsulating resin 29. Then, the electronic devices thus formed are separated, by means of a transverse cut made in the running direction of the laminated strips (21, 22) between two contiguous electronic devices 30.

This manufacturing process therefore makes it possible to continuously manufacture electronic devices (20, 30) according to the invention, at a high speed of more than 4000 units per hour with an excellent reliability rate.

The electronic devices (20; 30) obtained following the methods according to the invention are small, thin, calibrated chips. These chips can then be transferred, mainly by gluing, laminating or other known techniques, to supports such as sheets of paper intended for manufacturing passports or any other identity document.

In particular, the invention also relates to the use of an electronic device (20; 30) such as described above for manufacturing a passport comprising one or several pages containing identification information of its carrier, in which one of the pages of the passport comprises a cavity that can receive the electronic device (20; 30).

The invention claimed is:

1. A method of manufacturing a radiofrequency identification device, comprising the following steps:
    forming an antenna on a thin, flexible substrate;
    placing a perforated sheet comprising at least one cavity in the perforated sheet's thickness on said substrate;
    placing a microelectronic chip in each cavity of said perforated sheet and electronically connecting output contacts of the microelectronic chip to corresponding terminals of the antenna; and
    sealing off the cavity that contains the chip to thereby protect the connected microelectronic chip;
    wherein the perforated sheet is thicker than the microelectronic chip.

2. The manufacturing method according to claim 1, wherein the flexible substrate and the perforated sheet are continuous and packaged in a roll, such that multiple identification devices are assembled by continuous lamination, and the identification devices thus formed are separated by making a transverse cut between two contiguous identification devices.

3. The manufacturing method according to claim 1, wherein the perforated sheet is packaged in a roll and placed on the substrate by lamination on one face of the substrate covered with an adhesive film.

4. The manufacturing method according to claim 1, wherein, in order to electrically connect the output contacts of the microelectronic chip to the terminals of the antenna, the face of the chip that is opposite the face comprising the output contacts of the chip is glued to the substrate, so as to present the chip's output contacts towards the open end of the cavity, said cavity passing through the substrate, and wherein a connection is made by wire bonding between each output contact of the chip and a corresponding terminal of the antenna.

5. The manufacturing method according to claim 4, wherein, in order to seal the cavity that contains the chip, a liquid encapsulating resin is deposited in the cavity above the microelectronic chip and the connections to the terminals of the antenna, so as to at least partially fill the empty volume of the cavity, and then the liquid encapsulating resin is polymerised.

6. The manufacturing method according to claim 1, wherein, in order to electrically connect the output contacts of the microelectronic chip to the terminals of the antenna, the face of the chip opposite the face that contains the chip's output contacts is glued to the substrate, so that the chip presents the chip's output contacts towards the open end of the cavity, and wherein a connection is established by depositing a low-viscosity conductive substance between each output contact of the chip and a corresponding terminal of the antenna.

7. The manufacturing method according to claim 6, wherein, in order to seal the cavity that contains the chip, a liquid encapsulating resin is deposited in the cavity above the microelectronic chip and the connections to the terminals of the antenna, so as to at least partially fill the empty volume of the cavity, and then the liquid encapsulating resin is polymerised.

8. The manufacturing method according to claim 1, wherein, in order to electrically connect the output contacts of the microelectronic chip to the terminals of the antenna, the face of the chip that contains the chip's output contacts is glued to conductive bumps on the substrate, which are connected to the respective terminals of the antenna.

9. The manufacturing method according to claim 8, wherein, in order to seal the cavity that contains the chip, a liquid encapsulating resin is deposited in the cavity above the microelectronic chip and the connections to the terminals of the antenna, so as to at least partially fill the empty volume of the cavity, and then the liquid encapsulating resin is polymerised.

10. The manufacturing method according to claim 1, wherein the cavities of the perforated sheet do not pass through the sheet, and wherein the perforated sheet is laminated on the substrate after the connections have been established between the output contacts of the chip and the terminals of the antenna so that each cavity encapsulates and protects a microelectronic chip.

11. An electronic radiofrequency identification device obtained by means of the following manufacturing method:
    forming an antenna on a thin, flexible substrate;
    placing a perforated sheet comprising at least one cavity in the perforated sheet's thickness on said substrate;
    placing a microelectronic chip in each cavity of said perforated sheet and electronically connecting output contacts of the microelectronic chip to corresponding terminals of the antenna; and
    sealing off the cavity that contains the chip to thereby protect the connected microelectronic chip;
    wherein the perforated sheet is thicker than the microelectronic chip.

12. The electronic radiofrequency identification device according to claim 11, wherein the electronic radiofrequency identification device's length is between 14 mm and around 25 mm, the electronic radiofrequency identification device's width is between 13 mm and around 19 mm, and the electronic radiofrequency identification device's thickness is less than 350 micrometers.

13. An electronic passport, comprising at least one page having a cavity in which an electronic radiofrequency identification device according to claim 12 is inserted and affixed.

14. An electronic passport, comprising at least one page having a cavity in which an electronic radiofrequency identification device according to claim 11 is inserted and affixed.

15. An electronic radiofrequency identification device comprising:
    a thin substrate supporting a microelectronic chip with output contacts;
    an antenna formed on the substrate, having terminals which are connected to corresponding output contacts of the microelectronic chip by interconnection means; and
    a perforated flat sheet which is thin and calibrated, said perforated sheet being mechanically fixed to one of the faces of the substrate and comprising a cavity in which the chip and the interconnection means are housed,
    wherein the substrate and the perforated sheet are stacked to form an assembly having a thickness less than 350 micrometers.

16. An electronic passport, comprising at least one page having a cavity in which an electronic radiofrequency identification device according to claim 15 is inserted and affixed.

* * * * *